(12) United States Patent
Shigemizu et al.

(10) Patent No.: US 9,026,389 B2
(45) Date of Patent: May 5, 2015

(54) STATE OF CHARGE COMPUTATION SYSTEM

(75) Inventors: Tetsuro Shigemizu, Tokyo (JP); Masami Iida, Tokyo (JP)

(73) Assignee: Mitsubishi Heavy Industries, Ltd., Tokyo (JP)

(*) Notice: Subject to any disclaimer, the term of this patent is extended or adjusted under 35 U.S.C. 154(b) by 336 days.

(21) Appl. No.: 13/389,758

(22) PCT Filed: Feb. 24, 2010

(86) PCT No.: PCT/JP2010/001237
§ 371 (c)(1),
(2), (4) Date: Apr. 12, 2012

(87) PCT Pub. No.: WO2011/104752
PCT Pub. Date: Sep. 1, 2011

(65) Prior Publication Data
US 2012/0310563 A1    Dec. 6, 2012

(51) Int. Cl.
*G01R 31/36*    (2006.01)

(52) U.S. Cl.
CPC .......... *G01R 31/361* (2013.01); *G01R 31/3613* (2013.01); *G01R 31/362* (2013.01)

(58) Field of Classification Search
CPC ................. G01R 31/3624; G01R 31/3651
USPC ........................................................ 702/63
See application file for complete search history.

(56) References Cited

U.S. PATENT DOCUMENTS

| | | | |
|---|---|---|---|
| 5,864,237 A * | 1/1999 | Kawai et al. | 324/430 |
| 2002/0196026 A1 * | 12/2002 | Kimura et al. | 324/426 |
| 2006/0220619 A1 * | 10/2006 | Namba et al. | 320/149 |
| 2006/0247871 A1 | 11/2006 | Emori et al. | |
| 2007/0148532 A1 | 6/2007 | Lim et al. | |
| 2007/0236183 A1 | 10/2007 | Darilek | |

(Continued)

FOREIGN PATENT DOCUMENTS

| | | |
|---|---|---|
| CN | 1163020 A | 10/1997 |
| JP | 5-322998 A | 12/1993 |
| JP | 2006-58114 A | 3/2006 |

(Continued)

OTHER PUBLICATIONS

Decision to Grant dated Jun. 20, 2014, issued in European Patent Application No. 10846421.5 (2 pages).
Korean Notice of Allowance dated Oct. 29, 2013, issued in Korean Patent Application No. 10-2012-7003372 with English translation (4 pages).
International Search Report of PCT/JP2010/001237, mailing date of Jun. 1, 2010.

(Continued)

*Primary Examiner* — Tung S Lau
*Assistant Examiner* — Xiuquin Sun
(74) *Attorney, Agent, or Firm* — Westerman, Hattori, Daniels & Adrian, LLP

(57) ABSTRACT

A first estimated state of charge is output based on an estimated open voltage of a secondary battery. A second estimated state of charge is output based on the result obtained by integrating the measured current of the secondary battery and the upper limit of the error of the measured current and the capacity of the secondary battery. A third estimated state of charge is output based on the result obtained by integrating the measured current and the lower limit of the error of the measured current and the battery capacity. A fourth estimated state of charge is output based on the result obtained by integrating the measured current and the battery capacity. The fourth estimated state of charge is output as a state of charge within the period of the predetermined period.

10 Claims, 12 Drawing Sheets

(56) References Cited

U.S. PATENT DOCUMENTS

2010/0201323 A1* 8/2010 Okamura ............... 320/134
2012/0310563 A1* 12/2012 Shigemizu et al. ............ 702/63

FOREIGN PATENT DOCUMENTS

| | | |
|---|---|---|
| JP | 3767150 B2 | 4/2006 |
| KR | 10-2005-0007283 A | 1/2005 |
| KR | 10-2007-0051916 A | 5/2007 |
| KR | 10-2009-0105754 A | 10/2009 |

OTHER PUBLICATIONS

Written Opinion of the International Searching Authority of PCT/JP2010/001237, mailing date of Jun. 1, 2010. (With partial translation).

Chinese Office Action dated Sep. 24, 2013, issued in corresponding Chinese Patent Application No. 2010800370032, w/ partial English translation.

Extended European Search Report dated Jul. 1, 2013, issued in corresponding European Patent Application No. 10846421.5 (4 pages).

* cited by examiner

STATE OF CHARGE COMPUTATION SYSTEM

TECHNICAL FIELD

The present invention relates to a state of charge computation system that calculates the state of charge of a secondary battery.

BACKGROUND ART

In recent years, the SOC (State of Charge; a charging state, and remaining capacity) of a battery has been calculated on the integrated value of a charging/discharging current of the battery. However, when SOC is calculated only by the integration of the charging/discharging current of the battery, a current detection error is accumulated in the integration and the state of charge, which is the calculation result after a predetermined period of time has elapsed, it is likely to be greatly different from the actual value. In order to avoid this phenomenon, Patent Document 1 discloses a technique which estimates a battery open voltage (the voltage of the battery from which the internal impedance of the battery is removed) when the charging/discharging of the current are inverted, calculates the state of charge from the battery open voltage, and corrects the state of charge calculated from the integration of the current. In addition, Patent Document 2 discloses a technique which estimates a battery impedance voltage, subtracts the battery impedance voltage from the measured voltage to calculate a battery open voltage, estimates the state of charge from the battery open voltage, and corrects the state of charge from the relationship between the battery open voltage and the state of charge calculated from the current.

PRIOR ART DOCUMENT

Patent Document

Patent Document 1: Japanese Published Unexamined Patent Application JP-A-11-206028
Patent Document 2: Japanese Published Unexamined Patent Application JP-A-2006-58114

SUMMARY OF INVENTION

Problem to be Solved by the Invention

However, in the technique disclosed in Patent Literature 1 or Patent Literature 2, the accuracy of estimating the battery impedance voltage is low and the state of charge calculated from the integration of the current is corrected on the basis of the battery open voltage even though an error is likely to occur in the battery open voltage calculated from the voltage of the battery. As a result, a large error is likely to occur between the obtained state of charge and an accurate value.

An object of the invention is to provide a state of charge computation system capable of improving the accuracy of calculating the state of charge.

Means for Solving the Problem

According to an aspect of the invention, there is provided a state of charge computation system including: a voltage-caused estimated state of charge calculating unit that outputs a first estimated state of charge on the basis of an estimated open voltage of a secondary battery; a current-caused estimated state of charge calculating unit that outputs a second estimated state of charge on the basis of the result obtained by integrating a measured current of the secondary battery and the upper limit of an error of the measured current with a predetermined cycle and the capacity of the secondary battery, outputs a third estimated state of charge on the basis of the result obtained by integrating the measured current and the lower limit of the error of the measured current with the predetermined cycle and the battery capacity, and outputs a fourth estimated state of charge on the basis of the result obtained by integrating the measured current with the predetermined cycle and the battery capacity; and a state of charge output unit that receives the first to fourth estimated states of charge, outputs the fourth estimated state of charge as a state of charge within the period of the predetermined period, outputs the first estimated state of charge as the state of charge when the first estimated state of charge is between the second estimated state of charge and the third estimated state of charge at an end point of the predetermined cycle, outputs the second estimated state of charge as the state of charge when the first estimated state of charge is equal to or greater than the second estimated state of charge, and outputs the third estimated state of charge as the state of charge when the first estimated state of charge is equal to or less than the third estimated state of charge.

Effect of Invention

According to the invention, even when the estimated internal impedance voltage of a secondary battery increases with the deterioration of the secondary battery and the estimated open voltage of the secondary battery is unreliable, the value which can be estimated to be optimal is determined to be the present state of charge from the relationship between SOCV calculated on the basis of an estimated open voltage VO[V] and an estimated state of charge SOC-H[%] or SOC-L[%] to which the error of the measured current I[A] is reflected. In this way, it is possible to reduce the mixture of the previously accumulated error with the calculated state of charge. As a result, it is possible to improve the accuracy of the calculation result of the state of charge.

DESCRIPTION OF EMBODIMENTS (First Embodiment)

Hereinafter, a state of charge computation system according to a first embodiment of the invention will be described with reference to the accompanying drawings.

Figure 1:
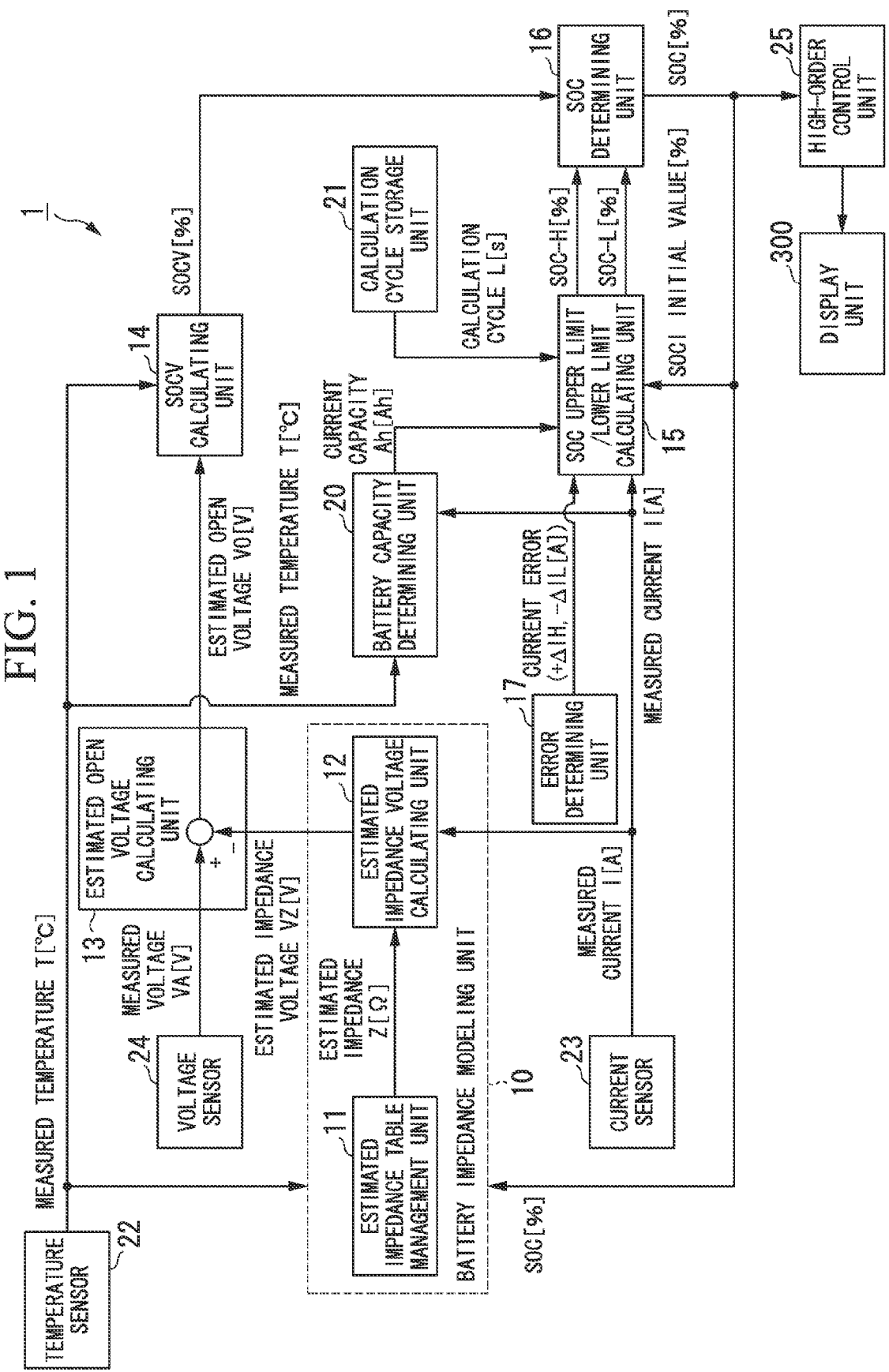
FIG. 1 is a diagram illustrating the structure of a state of charge computation system according to a first embodiment.

FIG. 1 is a diagram illustrating the structure of the state of charge computation system according to the first embodiment.

In FIG. 1, reference numeral 1 denotes the state of charge computation system. The state of charge computation system 1 includes processing units, such as an estimated impedance modeling unit 10 (including an estimated impedance table management unit 11 and an estimated impedance voltage calculating unit 12), an estimated open voltage calculating unit 13, an SOCV calculating unit 14, an SOC upper limit/lower limit calculating unit 15, and an SOC determining unit 16.

Next, the structure of each of the processing units included in the state of charge computation system 1 shown in FIG. 1 will be described.

The estimated impedance modeling unit 10 includes the estimated impedance table management unit 11 and the estimated impedance voltage calculating unit 12. The estimated impedance table management unit 11 stores, in a memory, a plurality of data tables in which the estimated internal impedance $Z[\Omega]$ of a secondary battery corresponding to the measured temperature $T[°C.]$ of a battery case of the secondary battery and the state of charge of the secondary battery is recorded. Specifically, the estimated impedance table management unit 11 includes data tables for each predetermined temperature (for example, every 1° C., such as 20° C., 21° C., and 22° C.) and one data table stores the estimated impedance values for each predetermined state of charge (for example, every 5%, such as 40%, 45%, and 50%).

The estimated impedance table management unit 11 receives the measured temperature $T[°C.]$ transmitted by a temperature sensor 22 which is connected to a secondary battery (see FIG. 9), which is a state of charge computation target, and a state of charge SOC(%) transmitted by the SOC determining unit 16, which will be described below, and transmits the estimated impedance $Z[\Omega]$ corresponding to the measured temperature $T[°C.]$ and the state of charge SOC (%) to the estimated impedance voltage calculating unit 12 using the data tables recorded in the estimated impedance table management unit 11.

In a case in which the measured temperature $T[°C.]$ is different from the temperature in the data tables, that is, T1 and T2 are closest to the measured temperature $T[°C.]$ in the data tables (T1[° C.]<T[° C.]<T2[° C.]) and T2−T1=ΔT and T−T1=ΔT1 are established, when (ΔT/2)≤ΔT1 is satisfied, the estimated impedance table management unit 11 selects the data table prepared for T2[° C.]. When ΔT1<(ΔT/2) is satisfied, the estimated impedance table management unit 11 selects the data table prepared for T1. For example, when the measured temperature is 21.4° C. and there are two data tables for 20° C. and 21° C. closest to the measured temperature, the data table for 20° C. is selected. The reason is that, as the data table for the temperature closer to the measured temperature $T[°C.]$ is used, it is possible to calculate the state of charge with a smaller error.

As described above, the estimated impedance table management unit 11 selects the data table corresponding to the measured temperature $T[°C.]$ and then selects the estimated impedance $Z[\Omega]$ corresponding to the state of charge SOC (%) received from the SOC determining unit 16. In a case in which the state of charge SOC (%) is different from a predetermined state of charge in the data table, that is, SOC1 and SOC2 among the states of charge in the selected data table are closest to the received state of charge SOC (%) (SOC1[%]<SOC[%]<SOC2[%]) and SOC2−SOC1=ΔSOC and SOC−SOC1=ΔSOC1 are established, when (ΔSOC/2)≤ΔSOC1 is satisfied, the estimated impedance table management unit 11 selects the estimated impedance corresponding to SOC2[%]. When ΔSOC1<(ΔSOC/2) is satisfied, the estimated impedance table management unit 11 selects the estimated impedance corresponding to SOC1. For example, when the state of charge SOC (%) received from the SOC determining unit 16 at a given measured temperature is 43% and there are two states of charge of 40% and 45% closest to the received state of charge SOC (%) in the data tables corresponding to the measured temperature, the estimated impedance corresponding to the state of charge of 45% is selected and is transmitted as the estimated impedance $Z[\Omega]$. The reason is that, as the estimated impedance corresponding to a state of charge closer to the state of charge SOC[%] is used, it is possible to calculate the state of charge with a smaller error.

The estimated impedance voltage calculating unit 12 is a processing unit that receives a measured current $I[A]$ which is transmitted by a current sensor 23 connected to the secondary battery (see FIG. 9), which is a state of charge computation target, and the estimated impedance $Z[\Omega]$, calculates an estimated impedance voltage $VZ[V]$, and transmits the estimated impedance voltage $VZ[V]$ to the estimated open voltage calculating unit 13, which will be described below. Specifically, the estimated impedance voltage calculating unit 12 calculates the estimated impedance voltage $VZ[V]$ using the following expression: the estimated impedance voltage $VZ[V]$= the measured current $I[A]$×the estimated impedance $Z[\Omega]$.

The estimated open voltage calculating unit 13 is a processing unit that receives a measured voltage $VA[V]$ transmitted by a voltage sensor 24 which is connected to the secondary battery (see FIG. 9), which is a state of charge computation target, and the estimated impedance voltage $VZ[V]$ subtracts the estimated impedance voltage $VZ[V]$ from the measured voltage $VA[V]$ to calculate the estimated open voltage $VO[V]$ of the secondary battery, and transmits the calculated estimated open voltage $VO[V]$ to the SOCV calculating unit 14, which will be described below.

The SOCV calculating unit 14 (voltage-caused estimated state of charge calculating unit) is a processing unit that receives the estimated open voltage $VO[V]$ and the measured temperature $T[°C.]$ transmitted by the temperature sensor 22 and transmits SOCV[%] (the estimated state of charge of the secondary battery based on the estimated open voltage) to the SOC determining unit 16, which will be described below, on the basis of the two information items. The SOCV calculating unit 14 is also referred to as a processing unit that calculates the estimated state of charge caused by the voltage.

The SOCV calculating unit 14 includes a plurality of data tables in which SOCV[%] corresponding to the measured temperature $T[°C.]$ and the estimated open voltage $VO[V]$ is recorded. Specifically, the SOCV calculating unit 14 includes data tables for each predetermined temperature (for example, every 1° C., such as 20° C., 21° C., and 22° C.) and one data table stores the value of SOCV[%] for each predetermined estimated open voltage VO[V] (for example, every 0.1 V, such as 5.0V, 5.1V, and 5.2V).

Similarly to the process of the estimated impedance modeling unit 10, in a case in which the measured temperature T[° C.] is different from the temperature corresponding to the data table, that is, T1 and T2 are closest to the measured temperature T[° C.] in the data tables (T1[° C.]<T[° C.]<T2[° C.]) and T2−T1=ΔT and T−T1=ΔT1 are established, when (ΔT/2)≤ΔT1 is satisfied, the SOCV calculating unit 14 selects the data table prepared for T2[° C.]. When ΔT1<(ΔT/2) is satisfied, the SOCV calculating unit 14 selects the data table prepared for T1.

After selecting the data table corresponding to the measured temperature T[° C.] as described above, the SOCV calculating unit 14 selects SOCV[%] corresponding to the estimated open voltage VO[V] received from the estimated open voltage calculating unit 13. In a case in which the estimated open voltage VO[V] is different from a predetermined estimated open voltage in the data table, that is, VO1 and VO2 among the predetermined estimated open voltages in the selected data table are closest to the received estimated open voltage VO[V] (VO1[V]<VO[V]<VO2[V]) and VO2−VO1=ΔVO and VO−VO1=ΔVO1 are established, when (ΔVO/2)≤ΔVO1 is satisfied, the SOCV calculating unit 14 selects the estimated open voltage corresponding to VO2[V]. When ΔVO1<(ΔVO/2) is satisfied, the SOCV calculating unit 14 selects the estimated open voltage corresponding to VO1. For example, when the estimated open voltage received from the estimated open voltage calculating unit 13 at a given measured temperature is 5.04 V and two estimated open voltages of 5.0 V and 5.1 V are closest to the estimated open voltage in the data table corresponding to the measured temperature, the SOCV calculating unit 14 selects SOCV[%] corresponding to the estimated open voltage of 5.0 V and transmits the selected SOCV[%] to the SOC determining unit 16. The reason is that, as the value of SOCV[%] corresponding to the estimated open voltage closer to the estimated open voltage VO[V] transmitted from the estimated open voltage calculating unit 13 is used, it is possible to calculate the state of charge with a smaller error.

In an assembled battery including a plurality of cells, there are a plurality of measured voltages VA[V]. For example, when a case in which the number of cells is N is considered, for example, the maximum cell voltage VAMAX[V], the minimum cell voltage VAMIN[V], the average cell voltage VAVR =(VA1+VA2+. . .+VAN)/N[V], and the intermediate cell voltage VAMID =(VAMAX+VAMIN)/2[V] of cell voltages VA1, VA2, . . . , VAN[V] may be determined to be representative cell voltages of the assembled battery and may be used in the assembled battery.

The cell voltages VA1, VA2, . . . , VAN[V] and the estimated impedance voltages VZ1, VZ2, . . . , VZN[V] may be calculated. The estimated open voltages V01, V02, . . . , VON[N] may be calculated from the differences VA1-VZ1, VA2-VZ2, . . . , VAN-VZN between the cell voltages and the estimated impedance voltages. The estimated states of charge SOCV1, SOCV2, . . . , SOCVN of the secondary battery may be calculated on the basis of the estimated open voltages based on the value. A maximum SOC SOCVMAX[%], a minimum SOC SOCVMIN[V], an average SOC SOCVAVR =(SOCV1+SOCV2+. . .+SOCVN)/N[V], and an intermediate SOC SOCMID =(SOCVMAX+SOCVMIN)/2 [%] may be used as representative SOCVs of the assembled battery on the basis of the estimated states of charge.

The SOC upper limit/lower limit calculating unit 15 (current-caused estimated state of charge calculating unit) is a processing unit that performs integration using the measured current I[A] transmitted from the current sensor 23, the upper limit ΔIH[A] and the lower limit ΔIL[A] of the error stored in the error determining unit 17, and the battery capacity Ah[Ah] stored in the battery capacity determining unit 20 for the period of a predetermined calculation cycle L[s], in response to a trigger signal which is generated for each calculation cycle L[s] by the calculation cycle storage unit 21, thereby calculating the upper limit SOC-H[%] (hereinafter, referred to as SOCH in some cases), the lower limit SOC-L[%] (hereinafter, referred to as SOCL in some cases)), and SOCI[%] of the estimated state of charge of the secondary battery, and transmits the calculated values to the SOC determining unit 16. The SOC upper limit/lower limit calculating unit 15 is also referred to as a processing unit that calculates a current-caused estimated state of charge.

SOCH, SOCL, and SOCI are calculated by the following expressions.

[Expression 1]

$$SOCI = SOCInit + 100 \times \int (I) dt / (3600 \times Ah) \quad (1)$$

[Expression 2]

$$SOCH = SOCInit + 100 \times \int (I + \Delta IH) dt / (3600 \times Ah) \quad (2)$$
$$= SOCI + 100 \times \int (\Delta IH) dt / (3600 \times Ah)$$

[Expression 3]

$$SOCL = SOCInit + 100 \times \int (I + \Delta IL) dt / (3600 \times Ah) \quad (3)$$
$$= SOCI + 100 \times \int (\Delta IL) dt / (3600 \times Ah)$$

The upper limit ΔIH[A] (ΔIH>0) and the lower limit ΔIL[A] (ΔIL<0) of the error are the upper limit and the lower limit of the error range of the sensitivity of the current sensor 23 and are fixed values which are preset by the current sensor 23 to be used. The two values are stored in a memory (for example, a non-volatile memory) of the error determining unit 17.

The battery capacity Ah[Ah] is the entire battery capacity preset to the secondary battery and may be a fixed value. In this case, the fixed values may be stored in a memory (for example, a non-volatile memory) of the battery capacity determining unit 20.

SOCIniT[%] is an initial value for each calculation cycle L[s] and is an output value from the SOC determining unit 16, which will be described below, that is, the optimal value transmitted from the SOC determining unit 16 except for the start of the system, which will be described below.

The integrated value in the above-mentioned expressions is obtained for the calculation cycle L[s].

In the present embodiment, the battery capacity stored in the battery capacity determining unit 20 is a fixed value. However, since the battery capacity varies depending on the temperature of a battery case and a current value output from the secondary battery, the battery capacity may be a variable having the two values as parameters in order to calculate the state of charge with a small error. In this case, the data is measured in advance to create a data table and the battery capacity is determined from the data table.

In this case, the battery capacity determining unit 20 receives the measured temperature T[° C.] transmitted by the temperature sensor 22 and the measured current I[A] transmitted by the current sensor 23 and transmits the battery capacity Ah[Ah] corresponding to the measured temperature T[° C.] and the measured current I[A] to the SOC upper limit/lower limit calculating unit 15 using the data table.

Specifically, the battery capacity determining unit 20 includes a plurality of data tables storing the battery capacity Ah[Ah] corresponding to the measured temperature T[° C.] and the measured current I[A]. The battery capacity determining unit 20 includes data tables for each predetermined temperature (for example, every 1° C., such as 20° C., 21° C., and 22° C.) and one data table stores the value of the battery capacity for each predetermined measured current I[A] (for example, every 0.1 A, such as 1.0 A, 1.1 A, and 1.2 A).

Similarly to the process of the estimated impedance table management unit 11, in a case in which the measured temperature T[° C.] is different from the temperature in the data table, that is, T1 and T2 are closest to the measured temperature T[° C.] in the data tables (T1[° C.]<T[° C.]<T2[° C.]) and T2−T1=ΔT and T−T1=ΔT1 are established, when (ΔT/2)≤ΔT1 is satisfied, the battery capacity determining unit 20 selects a data table prepared for T2[° C.]. When ΔT1<(ΔT/2) is satisfied, the battery capacity determining unit 20 selects a data table prepared for T1.

After selecting the data table corresponding to the measured temperature T[° C.] as described above, the battery capacity determining unit 20 selects the battery capacity corresponding to the measured current value I[A] transmitted from the current sensor 23. In a case in which the measured current I[A] is different from a predetermined measured current in the data table, that is, I1 and I2 are closest to the received measured current I[A] among the predetermined measured currents in the selected data table (I1[A]<I[A]<I2[I]) and I2−I1=ΔI and I−I1=ΔI1 are established, when (ΔI/2)≤ΔI1 is satisfied, the battery capacity determining unit 20 selects the battery capacity corresponding to I2[A]. When ΔI1<(ΔI/2) is satisfied, the battery capacity determining unit 20 selects the battery capacity corresponding to I1. For example, when the measured current value received from the current sensor 23 at a given measured temperature is 1.05 A and two measured current values of 1.0 A and 1.1 A in the data table corresponding to the measured temperature are closest to the received measured current value, the battery capacity determining unit 20 selects the battery capacity corresponding to the measured current value of 1.1 A and transmits the selected battery capacity as the battery capacity Ah[Ah] to the SOC upper limit/lower limit calculating unit 15. The reason is that, as the value of the battery capacity corresponding to the current value closer to the measured current value [A] transmitted from the current sensor 23 is used, it is possible to calculate the state of charge with a smaller error.

The SOC determining unit 16 (state of charge output unit) receives the SOC-H[%], SOC-L[%], SOCI[%], and SOCV[%] from the SOC upper limit/lower limit calculating unit 15 and the SOCV calculating unit 14. The SOC determining unit 16 is a processing unit that selects one of the three values of SOC-H[%], SOC-L[%], and SOCV[%] as the optimal value closest to the actual state of charge.

The selected optimal value is transmitted as the state of charge SOC(%) from the SOC determining unit 16 to a high-order control unit 25 that controls, for example, the charging/discharging of the secondary battery using the state of charge for each calculation cycle L[s]. Then, the SOC determining unit 16 transmits SOCI[%] as the state of charge SOC(%) to the high-order control unit 25 within the period of the calculation cycle L[s].

A mechanism for selecting the optimal value will be described below with reference to FIGS. 2, 3, and 4.

Figure 9:
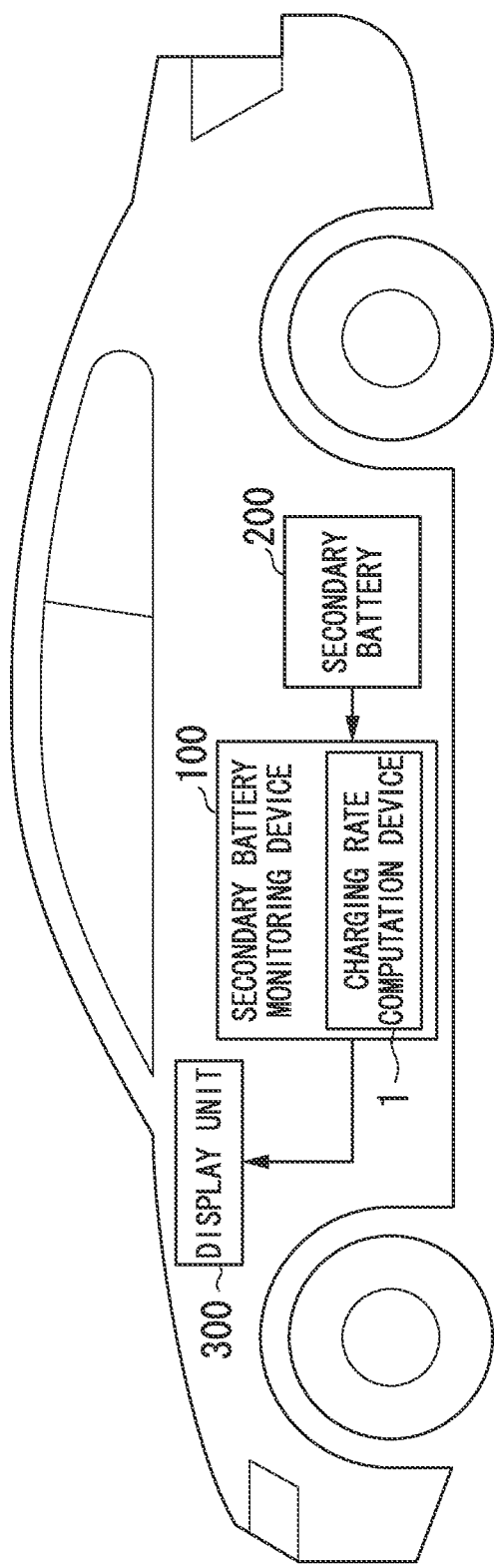
FIG. 9 is a diagram illustrating an example of the use of the state of charge computation system.

The high-order control unit 25 transmits the value of the received state of charge SOC(%) to, for example, a display unit 300 shown in FIG. 9 and the display unit 300 displays the state of charge using light and sounds such that the user of the state of charge computation system recognizes the state of charge.

As the state of charge computation system 1, for example, there are battery systems for moving bodies, such as industrial vehicles including forklifts, electric vehicles, hybrid vehicles, ships, and airplanes including power motors driven by the secondary batteries, and fixed battery systems, such as household power systems.

Immediately before a start switch of the battery system is turned off and the supply of power from the secondary battery to a device, such as the SOC determining unit 16, in the battery system is cut, the high-order control unit 25 stores the previous state of charge SOC (%) transmitted from the SOC determining unit 16 in the non-volatile memory provided therein. Immediately after the start switch is turned on and the supply of power to the secondary battery to a device, such as the SOC determining unit 16, in the battery system starts, the high-order control unit 25 transmits the state of charge SOC (%) stored in the non-volatile memory as SOCIniT[%] to the SOC upper limit/lower limit calculating unit 15 and the estimated impedance table management unit 11. In this way, even before the SOC determining unit 16 transmits the optimal value at the time when the start switch is turned on, it is possible to give SOCIniT[%]. Therefore, it is possible to perform calculation such that each of the above-mentioned expressions is established.

When the impedance voltage generated by the influence of a charging/discharging current for the period for which the start switch is turned off is sufficiently less than the measured voltage and is negligible, SOCV may be used instead of SOCIniT[%].

As described above, the estimated impedance table management unit 11, the SOCV calculating unit 14, and the battery capacity determining unit 20 select the values to be transmitted, that is, the estimated impedance Z[Ω], SOCV [%], and the battery capacity Ah[Ah] using a plurality of data tables corresponding to the two received parameters and transmit the selected values. As described above, the two parameters are the measured temperature T[° C.] and the state of charge SOC (%) in the estimated impedance table management unit 11. The two parameters are the measured temperature T[° C.] and the estimated open voltage VO[V] in the SOCV calculating unit 14. The two parameters are the measured temperature T[° C.] and the measured current I[A] in the battery capacity determining unit 20.

First, each of the units selects the data table corresponding to the measured temperature T[° C.], which is one of the two parameters, and selects the value to be transmitted using the other parameter. When a value corresponding to the other parameter is not prepared in the data table, a value closest to the value corresponding to the other parameter among the prepared values is regarded as the value of the other parameter and is used as the value to be transmitted.

However, in order to further reduce the error of the state of charge SOC (%), the transmission value may be determined using the linear ratio of the value of the other parameter (referred to as P) with respect to the nearest value (referred to as the nearest value 1) less than the value of the other parameter and the nearest value (referred to as the nearest value 2) greater than the value of the other parameter among the prepared values.

In this case, when the transmission value corresponding to the nearest value 1 in the data table is transmission value 1 and the transmission value corresponding to the nearest value 2 in the data table is transmission value 2, the following transmission value is actually transmitted: a transmission value=transmission value 1+(transmission value 2−transmission value 1)×(P−the nearest value 1)/(the nearest value 2−the nearest value 1).

For example, as described above, the estimated impedance table management unit 11 includes the data tables for each predetermined temperature (for example, every 1° C., such as 20° C., 21° C., and 22° C.) and one data table stores an estimated impedance value for each predetermined state of charge (for example, every 5%, such as 40%, 45%, and 50%).

When the state of charge SOC (%) received from the SOC determining unit 16 at a given measured temperature is 43%, two states of charge of 40% and 45% in the data table corresponding to the measured temperature are closest to the state of charge SOC (%), the estimated impedance corresponding to the state of charge of 40% is 0.001Ω, and the estimated impedance corresponding to the state of charge of 45% is 0.002Ω in the data table, the value of the estimated impedance Z[Ω] transmitted from the estimated impedance table management unit 11 is 0.0016 [Ω]=0.001 [Ω]+(0.002 [Ω]−0.001 [Ω])×(43[%]−40[%])/(45[%]−40[%]).

The SOCV calculating unit 14 can perform the same process in each battery capacity determining unit 20.

Next, the optimal value selecting process of the state of charge computation system 1 will be described in detail.

Figure 2:
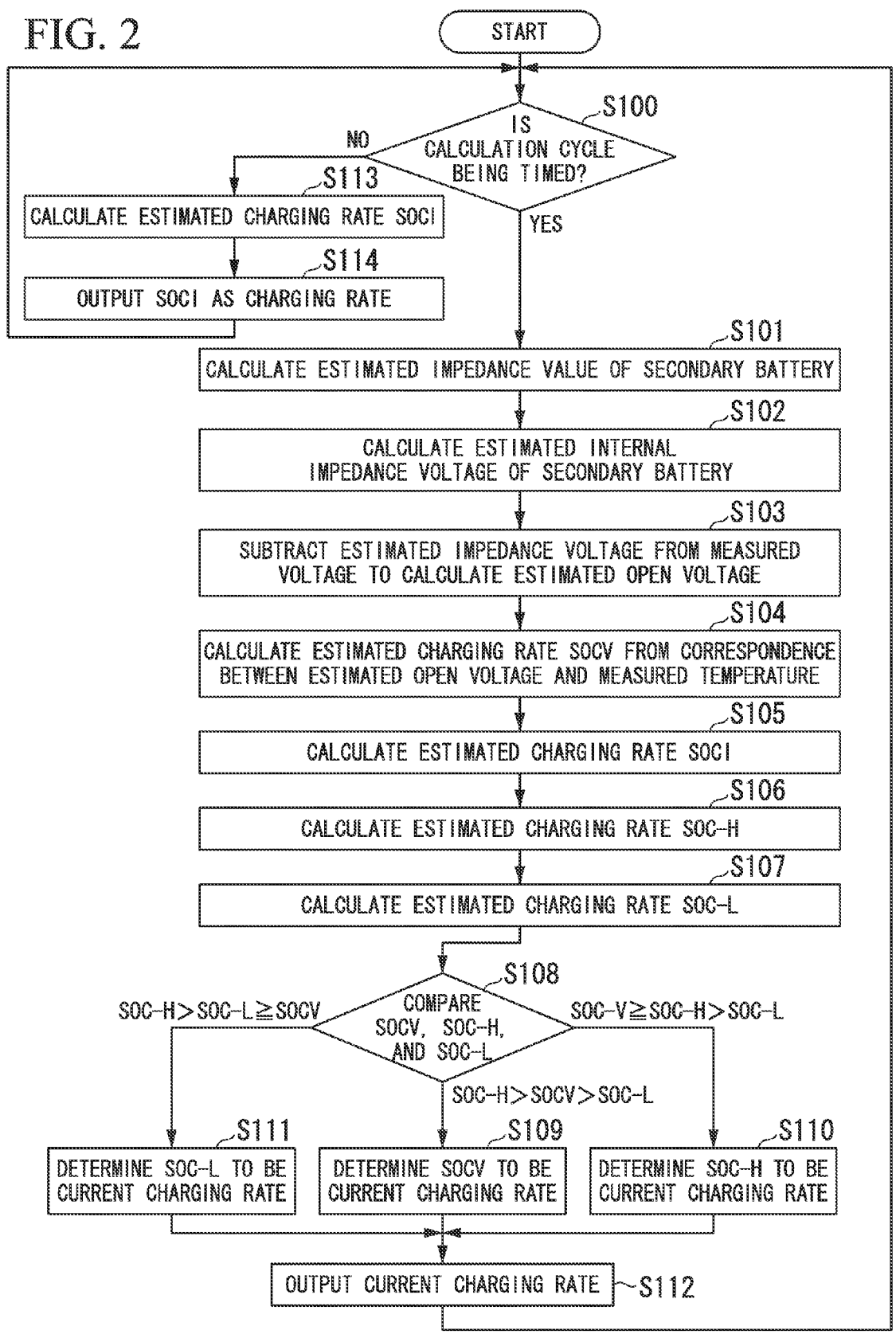
FIG. 2 is a diagram illustrating the process flow of the state of charge computation system.

FIG. 2 is a diagram illustrating the process flow of the state of charge computation system.

First, the estimated impedance modeling unit 10 determines whether it is the timing of the calculation cycle L[s] (Step S100). Whenever the time comes, the estimated impedance table management unit 11 determines the estimated impedance value of the secondary battery corresponding to the measured temperature T[° C.] and SOC[%] (the initial value of SOC in the first calculation) (Step S101).

Then, the estimated impedance voltage calculating unit 12 in the estimated impedance modeling unit 10 calculates the estimated internal impedance voltage VZ[V] of the secondary battery using the measured current I[A] and the estimated impedance value Z[Ω] (Step S102) and outputs the estimated impedance voltage VZ[V] to the estimated open voltage calculating unit 13.

Then, the estimated open voltage calculating unit 13 subtracts the estimated impedance voltage VZ[V] from the measured voltage VA[V] to calculate the estimated open voltage VO[V] (Step S103). Then, the estimated open voltage calculating unit 13 outputs the calculated estimated open voltage VO[V] to the SOCV calculating unit 14.

The SOCV calculating unit 14 calculates the estimated state of charge SOCV from the correspondence between the estimated open voltage VO[V] and the measured temperature T[° C.] (Step S104). Then, the SOCV calculating unit 14 outputs the calculated SOCV[%] to the SOC determining unit 16.

When acquiring the timing signal of the calculation cycle L[s], the SOC upper limit/lower limit calculating unit 15 acquires the measured current I[A], the upper limit error ΔIH[A] of the measured current I[A] on the positive side, and the lower limit error ΔIL[A] of the measured current I[A] on the negative side. Then, the SOC upper limit/lower limit calculating unit 15 integrates the measured current I from the timing of the previous calculation cycle L[s] using Expression 1, thereby calculating the estimated state of charge SOCI (Step S105). In addition, the SOC upper limit/lower limit calculating unit 15 adds an estimated state of charge ΔSH obtained by integrating the upper limit error ΔIH from the timing of the previous calculation cycle L[s] to the estimated state of charge SOCI obtained by integrating the measured current I from the timing of the previous calculation cycle L[s] using Expression 2, thereby calculating the estimated state of charge SOC-H (Step S106). In addition, the SOC upper limit/lower limit calculating unit 15 subtracts an estimated state of charge ΔSL obtained by integrating the lower limit error ΔIL from the timing of the previous calculation cycle L[s] from the estimated state of charge SOCI obtained by integrating the measured current I from the timing of the previous calculation cycle L[s] using Expression 3, thereby calculating the estimated state of charge SOC-L (Step S107).

Then, the SOC upper limit/lower limit calculating unit 15 outputs the calculated SOC-H, SOC-L, and SOCI to the SOC determining unit 16.

The SOC determining unit 16 acquires three estimated states of charge SOCV[%], SOC-H[%], and SOC-L[%], and SOCI[%]calculation cycle L[s] (Step S108). by the above-mentioned process. The SOC determining unit 16 compares SOCV, SOC-H, and SOC-L at the timing of the calculation cycle L[s] (Step S108). When SOCV is between SOC-H and SOC-L, the SOC determining unit 16 determines SOCV to be the current state of charge (Step S109). In addition, when SOCV is equal to or more than the range of SOC-H and SOC-L I, the SOC determining unit 16 determines SOC-H to be the present state of charge (Step S110). When SOCV is equal to or less than the range of SOC-H and SOC-L, the SOC determining unit 16 determines SOC-L to be the present state of charge (Step S111).

Then, the state of charge computation system 1 performs the above-mentioned process for each calculation cycle L[s] and outputs the processing result to the present state of charge SOC[%] (Step S112).

The SOC upper limit/lower limit calculating unit 15 acquires the state of charge SOC[%] for each calculation cycle L[s] as the initial value SOCIniT[%], integrates the measured current until the timing of the next calculation cycle L[s], and adds the integration result to SOCIniT[%], thereby calculating the estimated state of charge SOCI (Step S113). Then, the SOC upper limit/lower limit calculating unit 15 outputs SOCI to the SOC determining unit 16 and the SOC determining unit 16 outputs SOCI as the present state of charge SOC[%] (Step S114).

In addition, the SOC determining unit 16 outputs the state of charge SOC[%] as an SOCI initial value to the SOC upper limit/lower limit calculating unit 15 and the battery impedance modeling unit 10.

Figure 3:
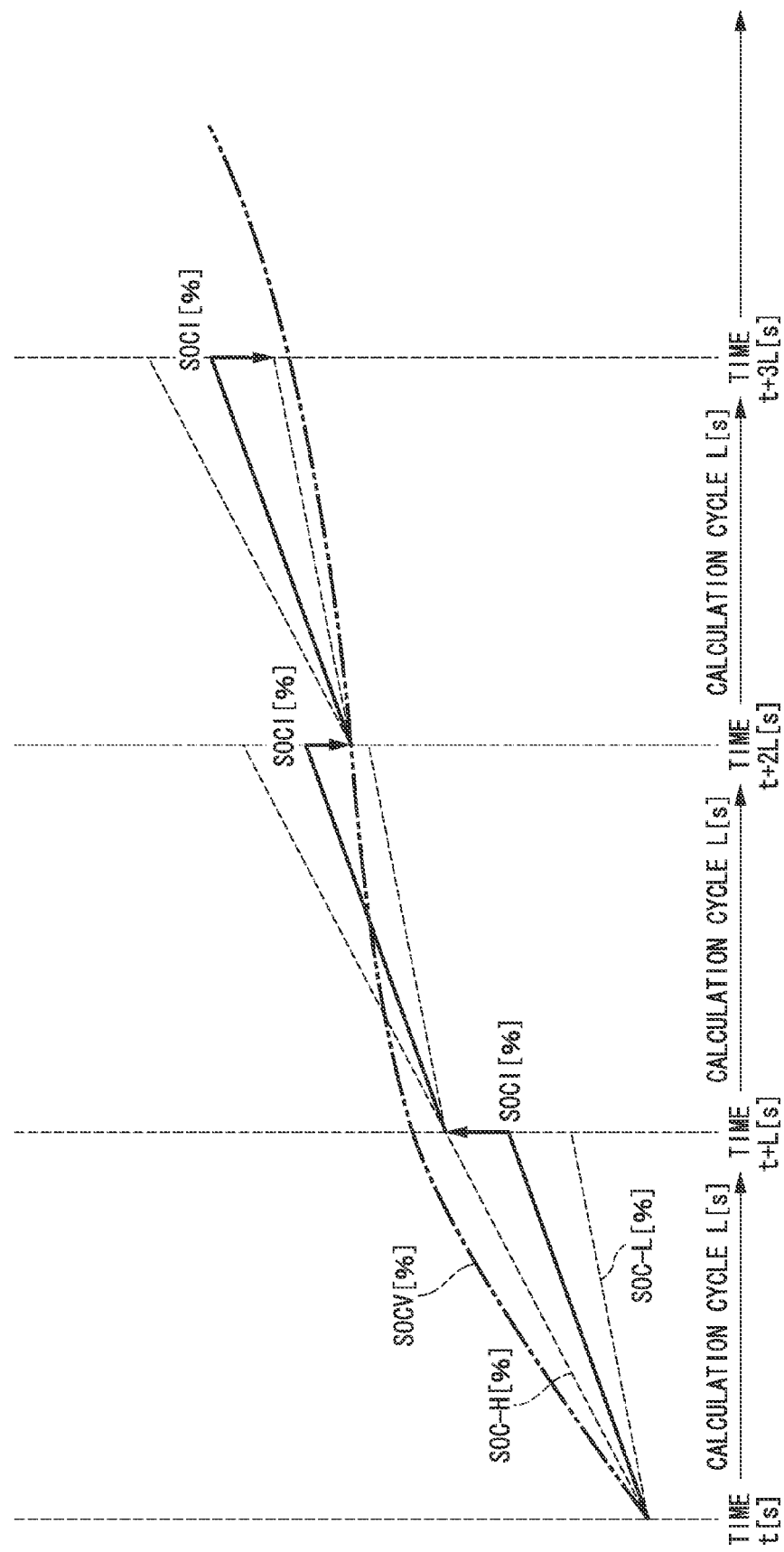
FIG. 3 is a first diagram illustrating the outline of the process of the state of charge computation system.

FIG. 3 is a first diagram illustrating the outline of the process of the state of charge computation system.

As shown in FIG. 3, the state of charge computation system 1 calculates SOCV[%], SOC-H[%], and SOC-L for the period from a time T[s] to a time t+L[s]. In addition, for the period from the time t to the time t+L[s], the state of charge computation system 1 integrates the measured current using the state of charge at the time T[s] as the initial value SOCIniT [%], thereby calculating the estimated state of charge SOCI [%] of the secondary battery. At the time t+L[s], since SOCV [%] is equal to or greater than the range of SOC-L[%] and SOC-H[%], the state of charge computation system 1 determines SOC-H[%] to be the state of charge of the current secondary battery. That is, the state of charge computation system 1 performs corrects the value of the estimated state of charge SOCI[%] of the secondary battery calculated by the previous measured current to the estimated state of charge SOC-H[%] which is calculated with the upper limit of the error of the measured current in the upward direction and outputs the corrected value.

The state of charge computation system 1 calculates SOCV [%], SOC-H[%], and SOC-L[%] for the period from the time t+L[s] to a time t+2L[s]. The state of charge computation system 1 integrates the measured current using the state of charge at the time t+L[s] as the initial value SOCIniT[%], thereby calculating the estimated state of charge SOC-I[%] of the secondary battery for the period from the time t+L[s] to the time t+2L[s]. At the time t+L[s], since SOCV[%] is within the range of SOC-L[%] and SOC-H[%], the state of charge computation system 1 determines SOCV[%] to be the state of charge of the current secondary battery. That is, the state of charge computation system 1 determines to what extent the value of SOCV is reliable, changes the value of the estimated state of charge SOCI[%] of the secondary battery which can be calculated by the measured current to the estimated state of charge SOCV calculated on the basis of the estimated open voltage, and outputs the estimated state of charge SOCV.

The state of charge computation system 1 calculates SOCV [%], SOC-H[%], and SOC-L[%] for the period from the time t+2L[s] to a time t+3L[s]. The state of charge computation system 1 integrates the measured current using the state of charge at the time t+2L[s] as the initial value SOCIniT[%], thereby calculating the estimated state of charge SOC-I[%] of the secondary battery for the period from the time t+2L[s] to the time t+3L[s]. At the time t+3L[s], since SOCV[%] is equal to or less than the range of SOC-L[%] and SOC-H[%], the state of charge computation system 1 determines SOC-L[%] to be the state of charge of the current secondary battery. That is, the state of charge computation system 1 corrects the value of the estimated state of charge SOCI[%] of the secondary battery calculated by the previous measured current to the estimated state of charge SOC-L[%] which is calculated with the lower limit of the error of the measured current in the downward direction and outputs the corrected value.

Figure 4:
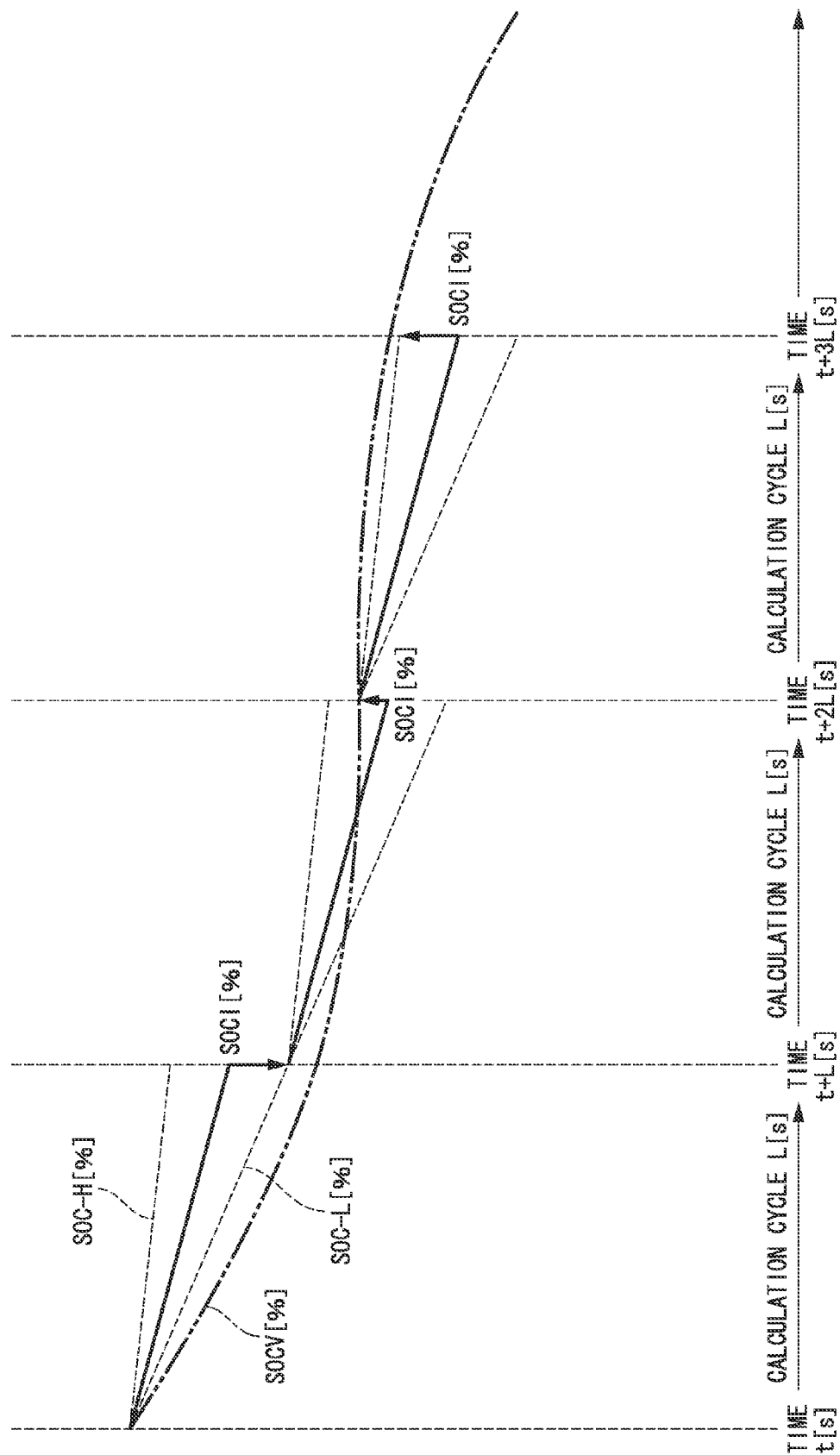
FIG. 4 is a second diagram illustrating the outline of the process of the state of charge computation system.

FIG. 4 is a second diagram illustrating the outline of the process of the state of charge computation system.

FIG. 3 shows the outline of the process when the state of charge of the secondary battery increases. However, FIG. 4 shows the outline of the process when the state of charge of the secondary battery is reduced. In FIG. 4, similarly to FIG. 3, the state of charge computation system 1 changes the value of SOCI[%] to the value of SOCV[%], SOC-H[%], or SOC-L[%] at the timing of each calculation cycle and determines the current state of charge. In this case, similarly, when SOCV [%] is within the range of SOC-H[%] and SOC-L[%], the state of charge computation system 1 determines SOCV[%] to be the present state of charge. When SOCV[%] is equal to or greater than the range of SOC-H[%] and SOC-L[%], the state of charge computation system 1 determines SOC-H[%] to be the present state of charge. When SOCV[%] is equal to or less than the range of SOC-H[%] and SOC-L[%], the state of charge computation system 1 determines SOC-L[%] to be the present state of charge.

According to the above-mentioned process, when it can be estimated that the value of SOCV[%] is within the reliable range (the range of the estimated power reception rates SOC-L[%] to SOC-H[%] to which the error of the measured current is reflected), the state of charge computation system 1 determines the value of SOCV[%] to be the current estimated state of charge SOC[%] for each calculation cycle.

When it can be estimated that the value of SOCV[%] is within the unreliable range (the range beyond the estimated power reception rates SOC-L[%] to SOC-H[%] to which the error of the measured current is reflected), the state of charge computation system 1 determines the upper limit SOC-H[%] or the lower limit SOC-L[%] of the error of SOCI[%] close to the value of SOCV[%] to be the current estimated state of charge SOC[%].

Therefore, even when the estimated internal impedance voltage of the secondary battery increases with the deterioration of the secondary battery and the estimated open voltage of the secondary battery is unreliable, the value which can be estimated to be optimal is determined to be the present state of charge from the relationship between SOCV calculated on the basis of the estimated open voltage VO[V] and the estimated state of charge SOC-H[%] or SOC-L[%] to which the error of the measured current I[A] is reflected. In this way, it is possible to reduce that the previously accumulated error is combined to the calculated state of charge and thus improve the accuracy of the calculation result of the state of charge.

Therefore, the user can obtain information about the state of charge with high accuracy. As a result, it is possible to improve the safety of the battery system of a moving body, such as an electric vehicle.

(Second Embodiment)

Figure 5:
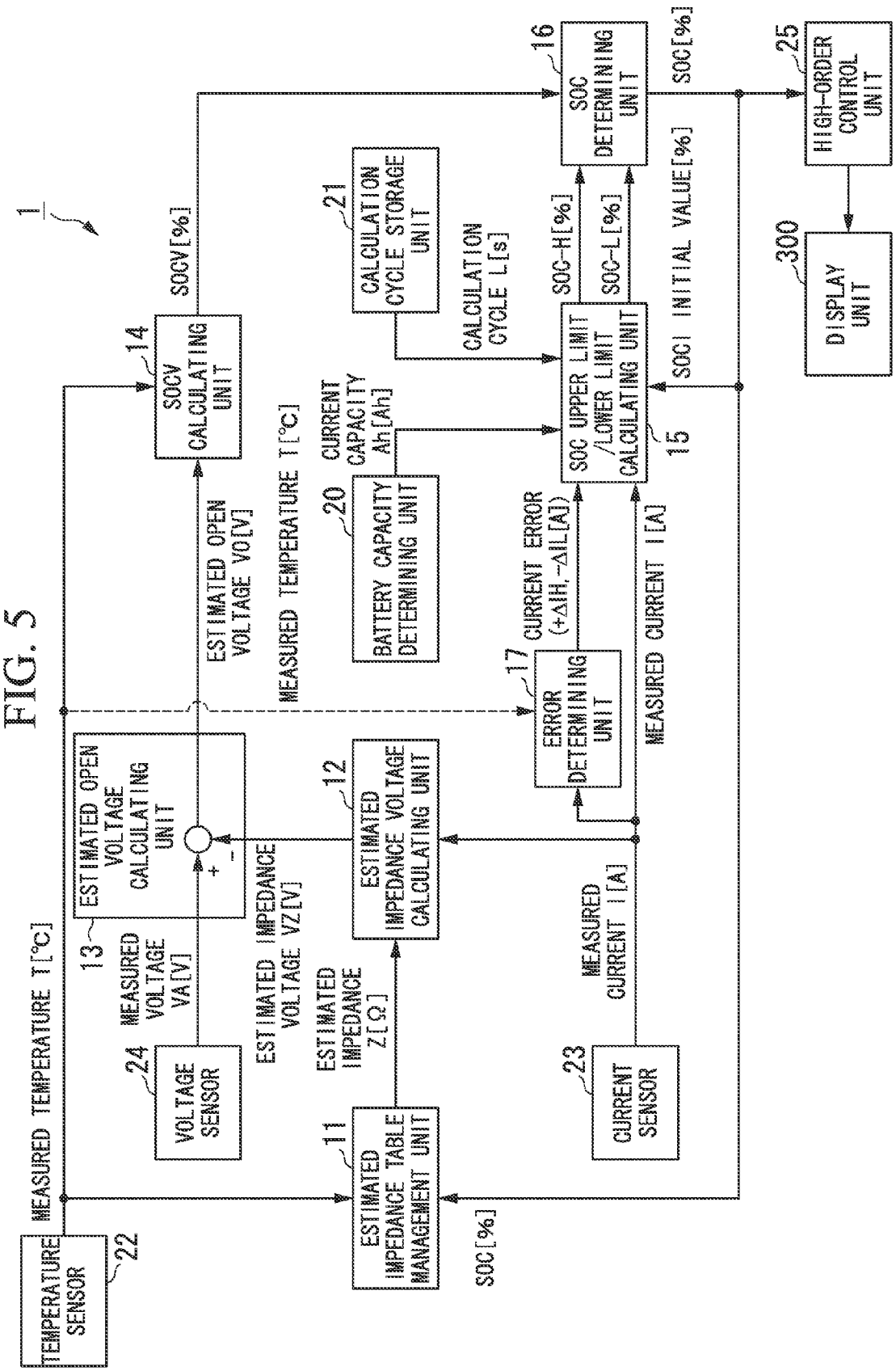
FIG. 5 is a diagram illustrating the structure of a state of charge computation system according to a second embodiment.

FIG. 5 is a diagram illustrating the structure of a state of charge computation system according to a second embodiment.

A state of charge computation system 1 shown in FIG. 5 differs from that according to the first embodiment in the process of the error determining unit 17. In the present embodiment, the same components as those in the first embodiment are denoted by the same reference numerals.

The error determining unit 17 acquires the measured temperature T[° C.] transmitted by the temperature sensor 22 and the measured current I[A] transmitted by the current sensor 23 and calculates the errors ΔIH and ΔIL of the measured current I[A] on the basis of the information. Then, the error determining unit 17 transmits the calculated errors ΔIH and ΔIL to the SOC upper limit/lower limit calculating unit 15. In the present embodiment, ΔIH and ΔIL are variable values, unlike the first embodiment.

Specifically, the error determining unit 17 includes a plurality of data tables in which ΔIH and ΔIL corresponding to the measured temperature T[° C.] and the measured current I[A] are recorded.

The data table is used by the same mechanism as that in the first embodiment and thus the description thereof will not be repeated.

The errors of the measured current I[A] may be calculated on the basis of the acquired measured temperature T[° C.] and measured current I[A] using an error computing expression, not the data table. The error determining unit 17 outputs the upper limit error ΔIH (ΔIH>0) of the measured current I[A] on the positive side and the lower limit error ΔIL (ΔIL<0) of the measured current I[A] on the negative side to the SOC upper limit/lower limit calculating unit 15.

According to the present embodiment, since ΔIH and ΔIL are variable values, it is possible to calculate the optimal state of charge SOC[%], as compared to the first embodiment.

(Third Embodiment)

Figure 6:
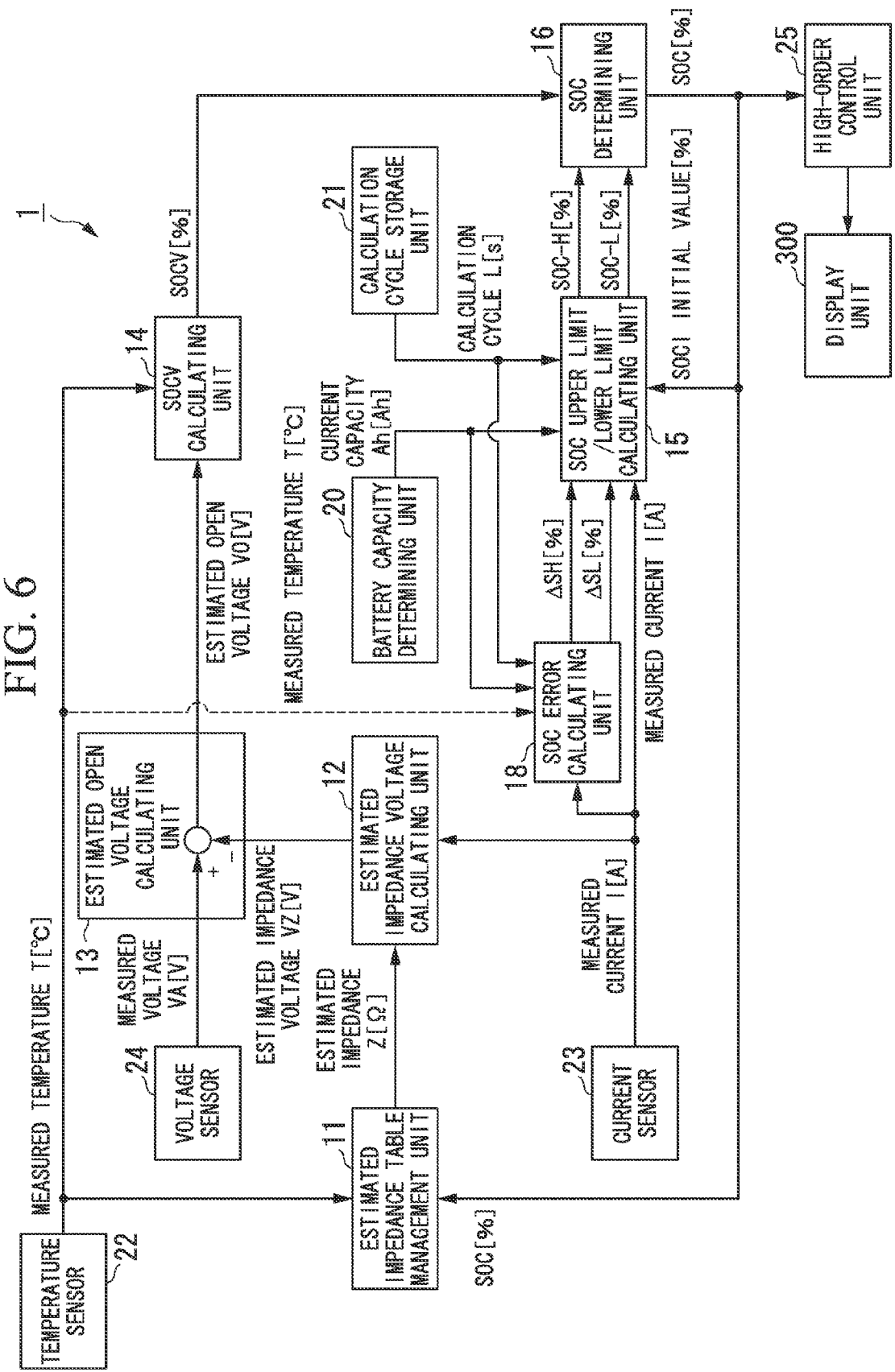
FIG. 6 is a diagram illustrating the structure of a state of charge computation system according to a third embodiment.

FIG. 6 is a diagram illustrating the structure of a state of charge computation system according to a third embodiment. The state of charge computation system further includes an SOC error calculating unit 18 in addition to the components shown in FIG. 1. The other components are the same as those in the first embodiment and are denoted by the same reference numerals.

The SOC error calculating unit 18 includes a plurality of data tables which are the same as those in the error determining unit 17 according to the second embodiment and are associated with information about the measured current I[A] and the measured temperature T[° C.] of the secondary battery. When receiving the timing signal of a calculation cycle L[s], the SOC error calculating unit 18 acquires the measured temperature T[° C.] and the measured current I[A] at that time and reads the errors ΔIH and ΔIL of the estimated state of charge on the positive and negative sides which correspond to the two parameters from the table. Then, the SOC error calculating unit 18 performs the next calculation process to calculate ΔSH and ΔSL and outputs ΔSH and ΔSL to the SOC upper limit/lower limit calculating unit 15.

$$\Delta SH = 100 \times \int (\Delta IH) dt/(3600 \times \Delta h) \quad \text{[Expression 4]}$$

$$\Delta SL = 100 \times \int (\Delta IL) dt/(3600 \times \Delta h) \quad \text{[Expression 5]}$$

In this case, the SOC error calculating unit 15 calculates SOC-H[%] and SOC-L[%] using the following expressions.

$$SOCH = SOCI + \Delta SH \quad \text{[Expression 6]}$$

$$SOCL = SOCI + \Delta SL \quad \text{[Expression 7]}$$

According to the present embodiment, the SOC error calculating unit 18 which is provided separately from the SOC upper limit/lower limit calculating unit 15 performs integration with the variables ΔIH and ΔIL and transmits ΔSH and ΔSL, which are the integration results, to the SOC upper limit/lower limit calculating unit 15. Therefore, it is possible to reduce the processing load of the SOC upper limit/lower limit calculating unit 15 compared to the second embodiment.

(Fourth Embodiment)

Figure 7:
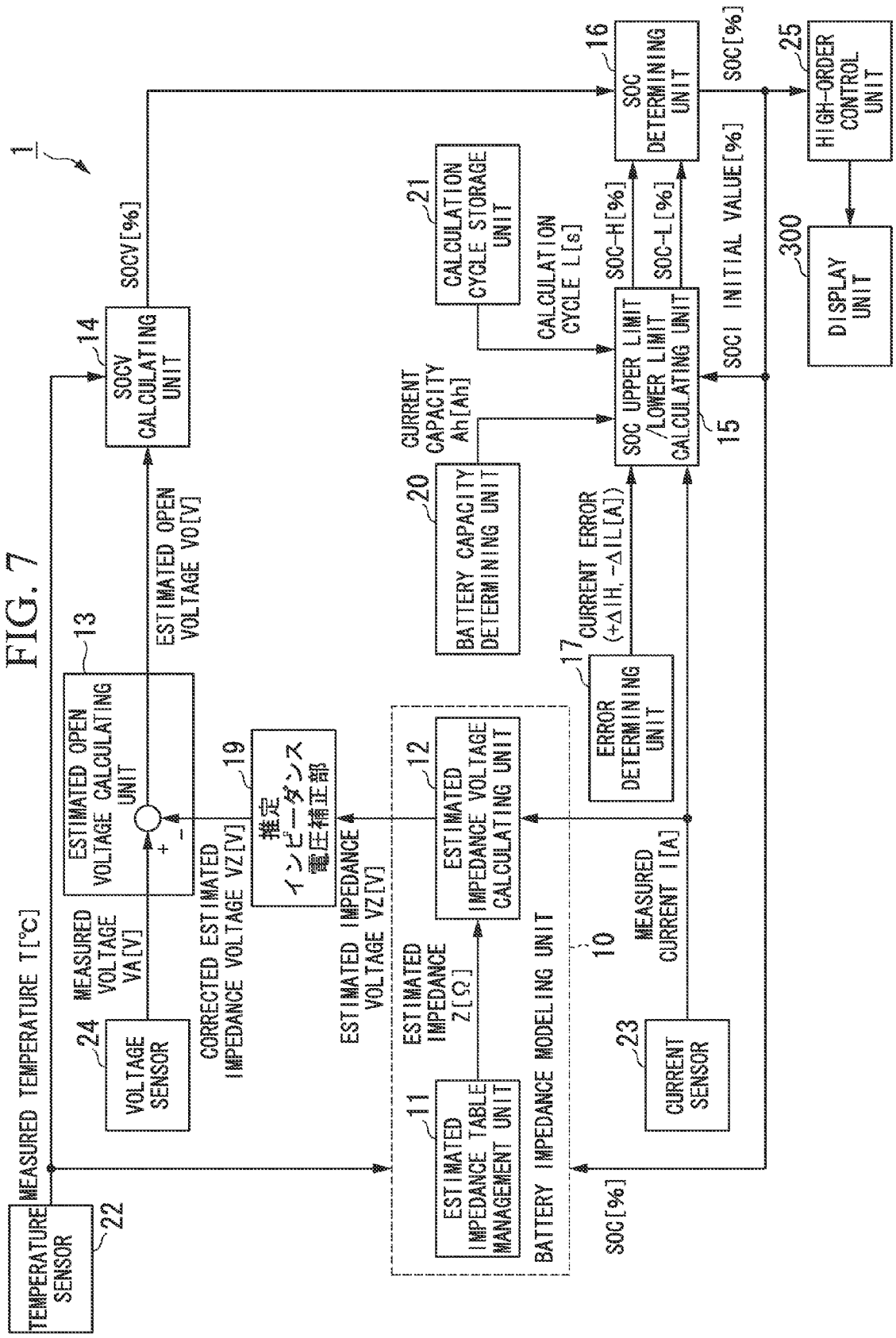
FIG. 7 is a diagram illustrating the structure of a state of charge computation system according to a fourth embodiment.
Figure 8:
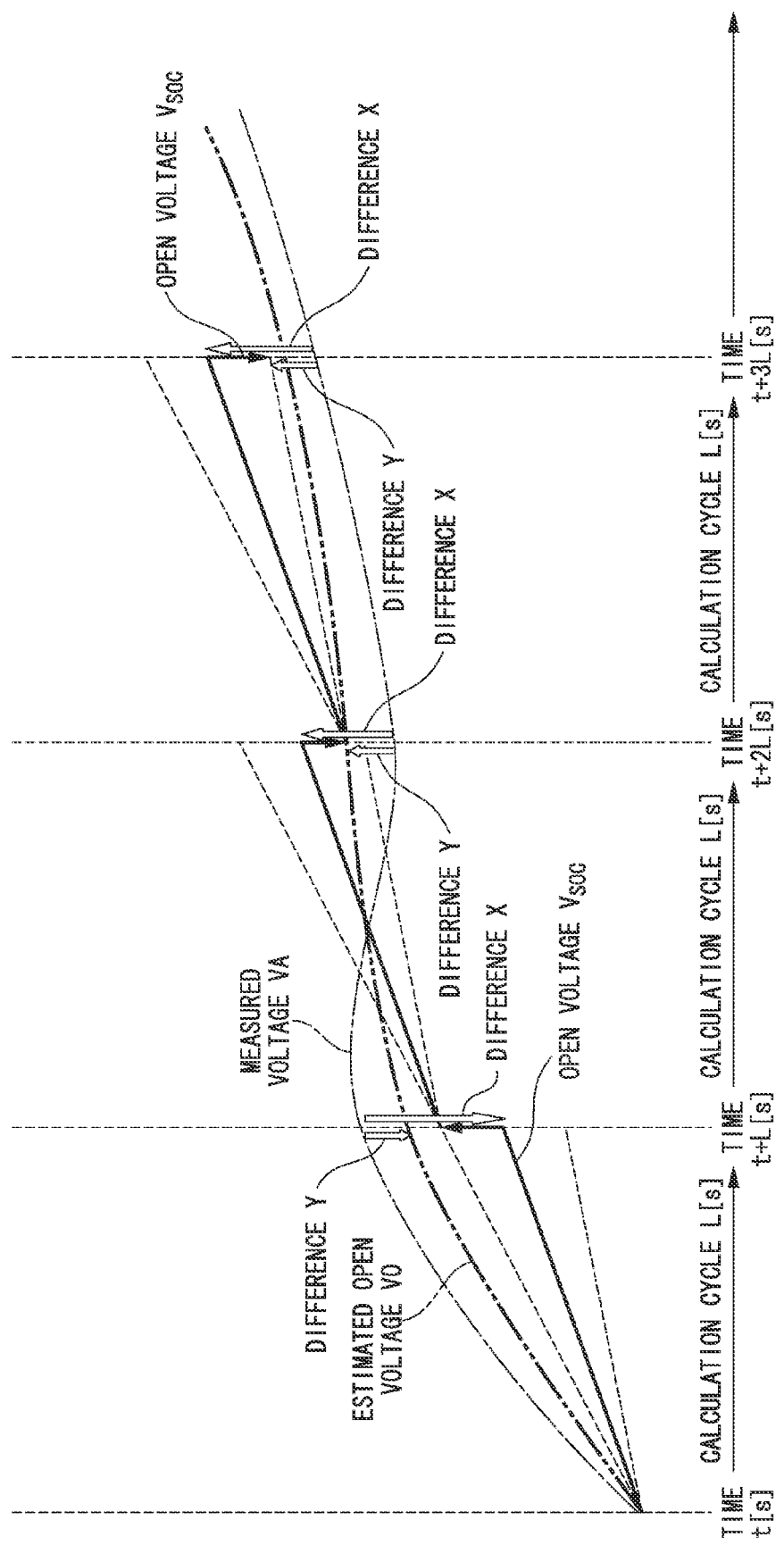
FIG. 8 is a diagram illustrating the outline of the calculation of a correction coefficient K.

FIG. 7 is a diagram illustrating the structure of a state of charge computation system according to a fourth embodiment. FIG. 8 is a diagram illustrating the outline of the calculation of a correction coefficient K. The state of charge computation system further includes an estimated impedance voltage correcting unit 19, in addition to the components shown in FIG. 1. The other components are the same as those in the first embodiment and are denoted by the same reference numerals.

The estimated impedance voltage correcting unit 19 stores a correction coefficient table in advance. Information stored in the correction coefficient table is the correction coefficient K of the estimated impedance voltage VZ[V]. In order to calculate the correction coefficient K, for example, first, the difference X between an open voltage $V_{SOC}$ which is calculated by the state of charge SOC[%] of the secondary battery at a given measured temperature T[° C.] for a predetermined period of time in the past when the error of the secondary battery is 0 and the measured voltage VA[V] of the secondary battery at the same measured temperature T[° C.] and state of charge SOC[%] is calculated.

In addition, the difference Y (corresponding to the estimated impedance output by the estimated impedance voltage calculating unit 12) between the estimated open voltage VO at the same measured temperature T[° C.] and state of charge SOC[%] of the secondary battery for a predetermined period of time in the past and the measured voltage VA[V] at the same measured temperature T[° C.] and state of charge SOC [%] is calculated.

Then, the average value of K (that is, K=the difference X/the difference Y) capable of establishing the difference Y×K=the difference X is calculated from the relationship between the difference X and the difference Y. The correction coefficient table stores the correction coefficients K for each combination of other measured temperatures T[° C.] and states of charge SOC[%].

When acquiring the estimated impedance voltage VZ[V] output from the estimated impedance voltage calculating unit 12, the estimated impedance voltage correcting unit 19 acquires the correction coefficient K corresponding to the measured temperature T[° C.] and the state of charge SOC[%] at that time or calculates the correction coefficient K using interpolation. Then, the estimated impedance voltage correcting unit 19 multiplies the value of the estimated impedance voltage VZ[V] output from the estimated impedance voltage calculating unit 12 by the correction coefficient K to calculate a corrected estimated impedance voltage VZ[V] and outputs the corrected estimated impedance voltage VZ[V] to the estimated open voltage calculating unit 13.

In this way, even when the actual impedance value of the secondary battery is changed by, for example, deterioration and is different from the value of the estimated impedance table management unit 11, the estimated impedance voltage VZ[V] capable of approximating the value of the estimated open voltage VO to the open voltage $V_{SOC}$ of the secondary battery close to the actual value is obtained. Therefore, it is possible to improve the accuracy of estimating the internal impedance of the secondary battery and approximate the value of the estimated state of charge SOCV[%] by the estimated open voltage to an accurate value.

(Fifth Embodiment)

Figure 10:
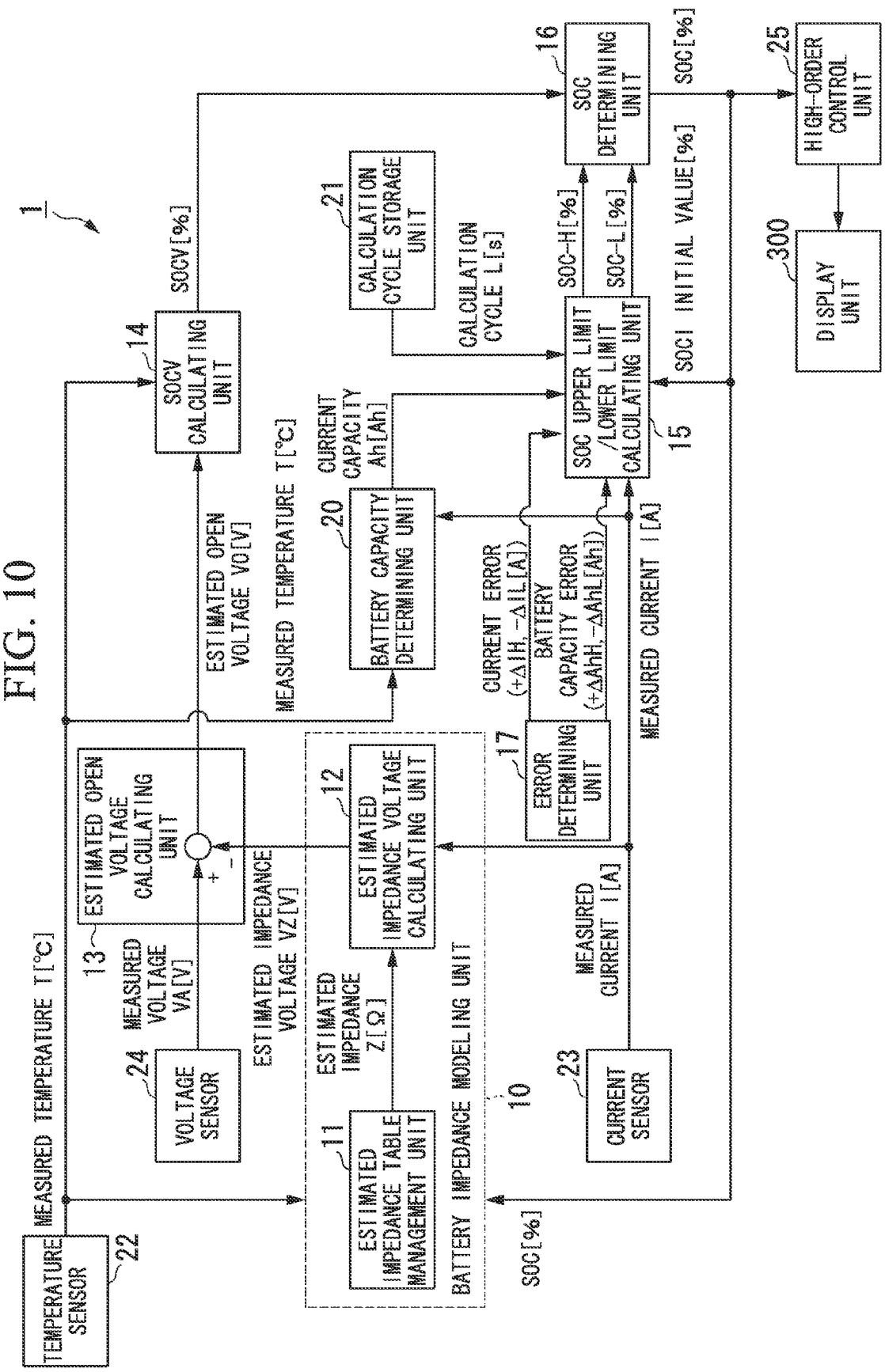
FIG. 10 is a diagram illustrating an example in which a battery capacity error is also reflected in the diagram illustrating the structure of the state of charge computation system according to the first embodiment.

FIG. 10 shows an example in which the error determining unit 17 shown in FIG. 1 stores the upper limit error ΔAhH (ΔAhH>0 and Ah+ΔAhH>0) on the positive side and the lower limit error ΔAhL (ΔAhL<0 and Ah+ΔAhL>0) on the negative side as the battery capacity errors in advance. The other structures are the same as those in the first embodiment.

In the present embodiment, ΔAhH and ΔAhL are fixed values and the SOC upper limit/lower limit calculating unit 15 receives ΔIH, ΔIL, ΔAhH, and ΔAhL from the error determining unit 17 at the same time. Then, the SOC upper limit/lower limit calculating unit 15 calculates SOCH and SOCL using the following expression.

If $(I+\Delta IH) \geq 0$, $$SOCH = SOCInit + 100 \times \int (I+\Delta IH) dt/(3600 \times Ah + \Delta AhL));$$
and If $(I+\Delta IH) \geq 0$, $$SOCH = SOCInit + 100 \times \int (I+\Delta IH) dt/(3600 \times Ah + \Delta AhH)); \quad \text{[Expression 8]}$$

If $(I+\Delta IL) \geq 0$, $$SOCL = SOCInit + 100 \times \int (I+\Delta IL) dt/(3600 \times Ah + \Delta AhH));$$
and If $(I+\Delta IL) < 0$, $$SOCL = SOCInit + 100 \times \int (I+\Delta IL) dt/(3600 \times Ah + \Delta AhL)) \quad \text{[Expression 9]}$$

In the present embodiment, since the battery capacity error is also considered in integration, it is possible to calculate the optimal state of charge SOC[%], as compared to the first embodiment.

(Sixth Embodiment)

Figure 11:
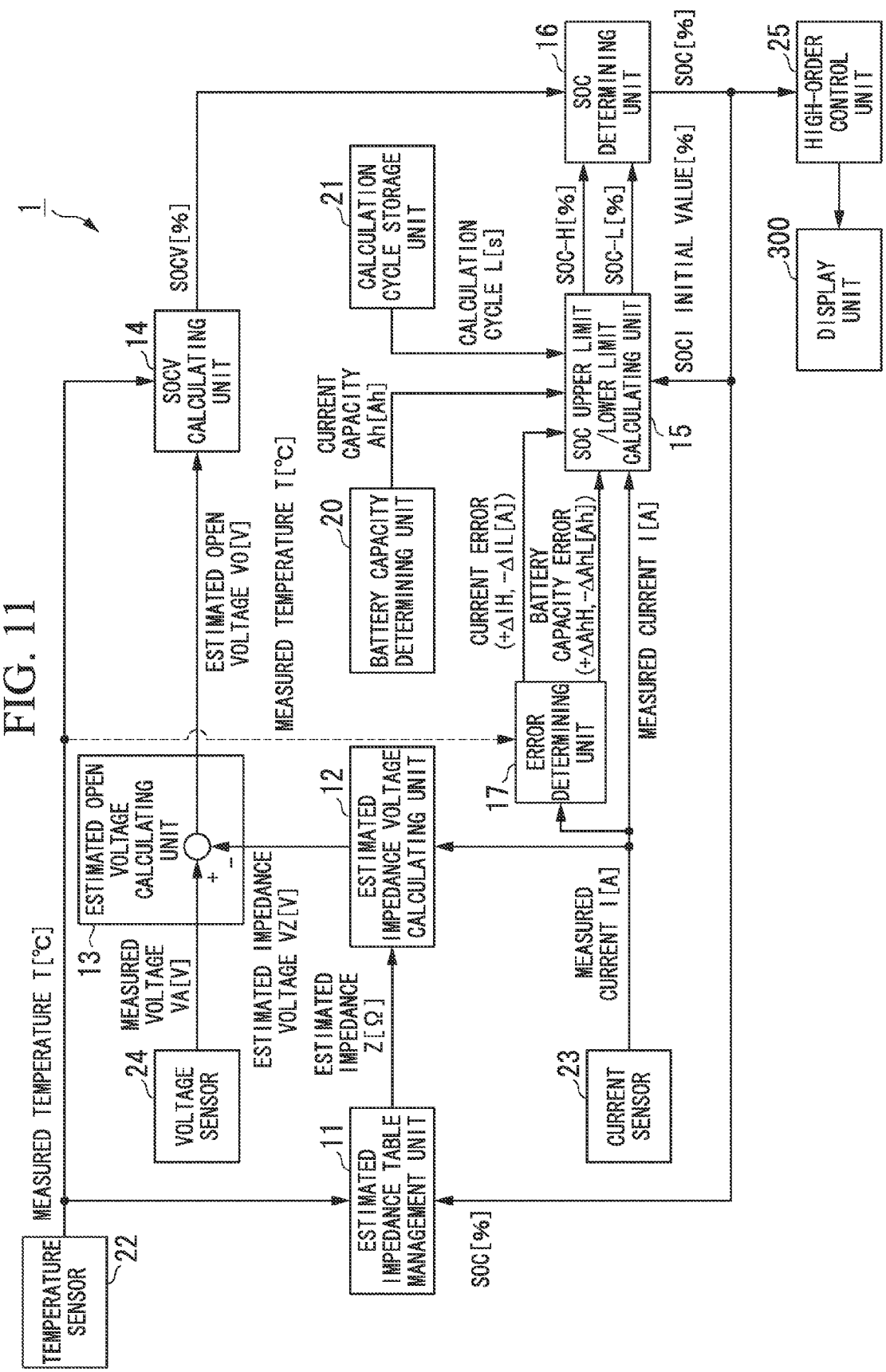
FIG. 11 is a diagram illustrating an example in which a battery capacity error is also reflected in the diagram illustrating the structure of the state of charge computation system according to the second embodiment.

FIG. 11 differs from the second embodiment in that the error determining unit 17 shown in FIG. 5 transmits the battery capacity errors ΔAhH and ΔAhL which are changed so as to correspond to the measured temperature T[° C.] and the measured current I[A] to the SOC upper limit/lower limit calculating unit 15. The other structures are the same as those in the second embodiment.

Specifically, the error determining unit 17 includes a plurality of data tables in which ΔAhH and ΔAhL corresponding to the measured temperature T[° C.] and the measured current I[A] are recorded.

The data table is used by the same mechanism as that in the first embodiment and thus the description thereof will not be repeated.

The SOC upper limit/lower limit calculating unit 15 receives ΔIH, ΔIL, ΔAhH, and ΔAhL from the error determining unit 17 at the same time. Then, the SOC upper limit/lower limit calculating unit 15 calculates SOCH and SOCL using Expression 8 and Expression 9.

According to the present embodiment, since the variable battery capacity error is also considered in integration, it is possible to calculate the optimal state of charge SOC[%], as compared to the second embodiment.

(Seventh Embodiment)

Figure 12:
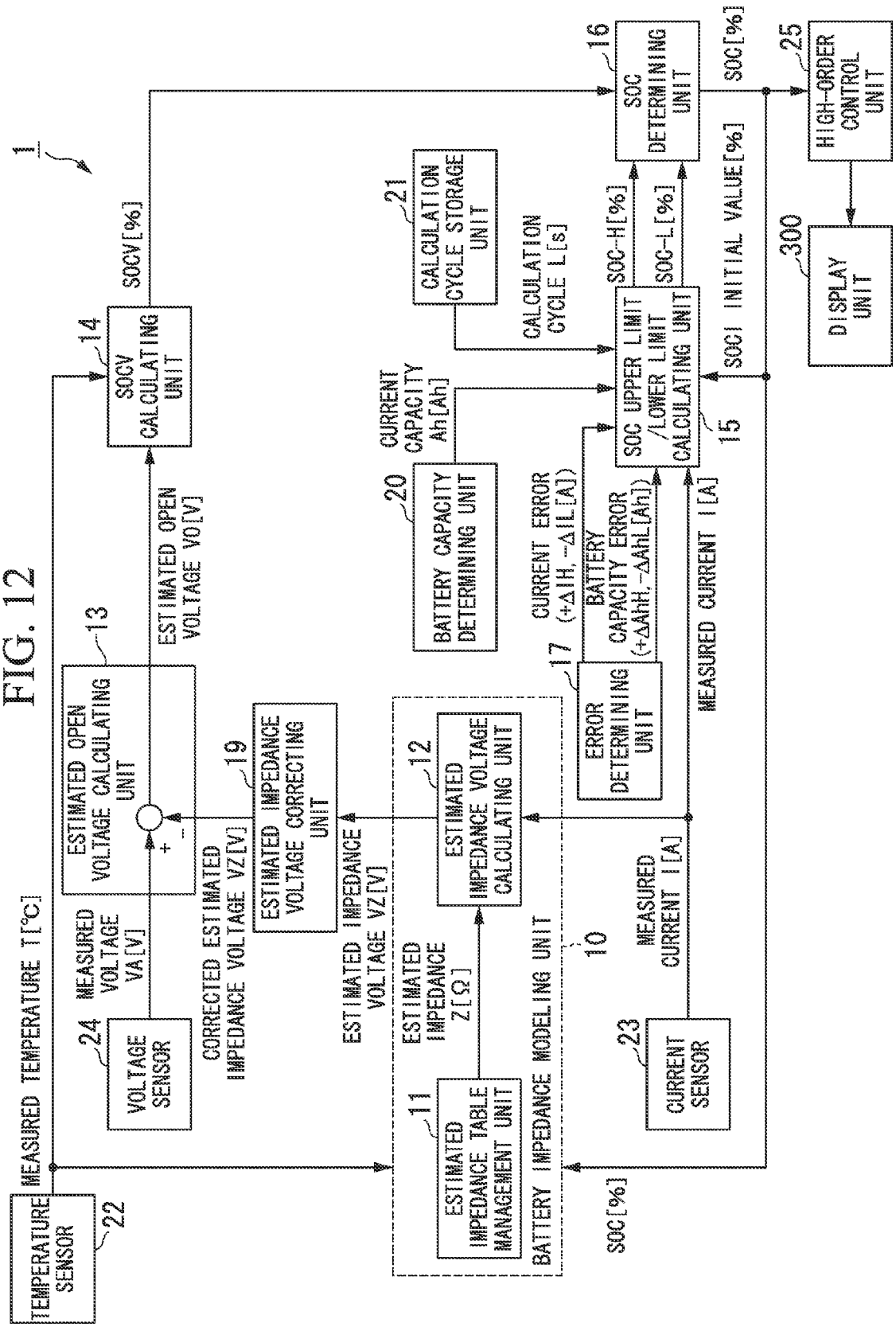
FIG. 12 is a diagram illustrating an example in which a battery capacity error is also reflected in the diagram illustrating the structure of the state of charge computation system according to the fourth embodiment.

FIG. 12 shows a seventh embodiment which differs from the fourth embodiment in that the error determining unit 17 shown in FIG. 7 transmits the battery capacity errors ΔAhH and ΔAhL which are changed so as to correspond to the measured temperature T[° C.] and the measured current I[A] to the SOC upper limit/lower limit calculating unit 15. The other structures are the same as those in the fourth embodiment.

The error determining unit 17 according to the present embodiment performs the same operation as the error determining unit 17 according to the sixth embodiment. The present embodiment is similar to the sixth embodiment in that the SOC upper limit/lower limit calculating unit 15 receives ΔIH, ΔIL, ΔAhH, and ΔAhL from the error determining unit 17 at the same time and calculates SOCH and SOCL using Expression 8 and Expression 9.

According to the present embodiment, since the variable battery capacity error is also considered in integration, it is possible to calculate the optimal state of charge SOC[%], as compared to the fourth embodiment.

FIG. 9 is a diagram illustrating an electric vehicle as an example of the state of charge computation system.

The present state of charge SOC[%] of the secondary battery is determined by the process according to any one of the first to seventh embodiments and is then output to a display unit 300. Therefore, the driver can know the state of charge of the secondary battery 200.

The exemplary embodiments of the invention have been described above, but the invention is not limited to the embodiments. The addition, omission, substitution, and other changes of the structures can be made without departing from the scope of the invention. The invention is not limited by the above description, but is limited only by the appended claims.

Industrial Applicability

The present invention relates to a state of charge computation system including: a voltage-caused estimated state of charge calculating unit that outputs a first estimated state of charge on the basis of an estimated open voltage of a secondary battery; a current-caused estimated state of charge calculating unit that outputs a second estimated state of charge on the basis of the result obtained by integrating a measured current of the secondary battery and the upper limit of an error of the measured current with a predetermined cycle and the capacity of the secondary battery, outputs a third estimated state of charge on the basis of the result obtained by integrating the measured current and the lower limit of the error of the measured current with the predetermined cycle and the battery capacity, and outputs a fourth estimated state of charge on the basis of the result obtained by integrating the measured current with the predetermined cycle and the battery capacity; and a state of charge output unit that receives the first to fourth estimated states of charge, outputs the fourth estimated state of charge as a state of charge within the period of the predetermined period, outputs the first estimated state of charge as the state of charge when the first estimated state of charge is between the second estimated state of charge and the third estimated state of charge at an end point of the predetermined cycle, outputs the second estimated state of charge as the state of charge when the first estimated state of charge is equal to or greater than the second estimated state of charge, and outputs the third estimated state of charge as the state of charge when the first estimated state of charge is equal to or less than the third estimated state of charge.

According to the state of charge computation system of the present invention, it is possible to improve the accuracy of the calculation result of the state of charge.

REFERENCE SIGNS LIST

10: BATTERY IMPEDANCE MODELING UNIT
11: ESTIMATED IMPEDANCE TABLE MANAGEMENT UNIT
12: ESTIMATED IMPEDANCE VOLTAGE CALCULATING UNIT
13: ESTIMATED OPEN VOLTAGE CALCULATING UNIT
14: SOCV CALCULATING UNIT
15: SOC UPPER LIMIT/LOWER LIMIT CALCULATING UNIT
16: SOC DETERMINING UNIT
17: ERROR DETERMINING UNIT
18: SOC ERROR CALCULATING UNIT
19: ESTIMATED IMPEDANCE VOLTAGE CORRECTING UNIT
20: BATTERY CAPACITY DETERMINING UNIT
21: CALCULATION CYCLE STORAGE UNIT
22: TEMPERATURE SENSOR
23: CURRENT SENSOR
24: VOLTAGE SENSOR
25: HIGH-ORDER CONTROL UNIT
100: SECONDARY BATTERY MONITORING DEVICE
200: SECONDARY BATTERY
300: DISPLAY UNIT

The invention claimed is:

1. A state of charge computation system comprising:
a voltage-caused estimated state of charge calculating unit that outputs a first estimated state of charge on the basis of an estimated open voltage of a secondary battery;
a current-caused estimated state of charge calculating unit that outputs a second estimated state of charge on the basis of the result obtained by integrating a measured current of the secondary battery and the upper limit of an error of the measured current with a predetermined cycle and the capacity of the secondary battery, outputs a third estimated state of charge on the basis of the result obtained by integrating the measured current and the lower limit of the error of the measured current with the predetermined cycle and the battery capacity, and outputs a fourth estimated state of charge on the basis of the result obtained by integrating the measured current with the predetermined cycle and the battery capacity;
a state of charge output unit that receives the first to fourth estimated states of charge, outputs the fourth estimated state of charge as a state of charge within the period of the predetermined period, outputs the first estimated state of charge as the state of charge when the first estimated state of charge is between the second estimated state of charge and the third estimated state of charge at an end point of the predetermined cycle, outputs the second estimated state of charge as the state of charge when the first estimated state of charge is equal to or greater than the second estimated state of charge, and outputs the third estimated state of charge as the state of charge when the first estimated state of charge is equal to or less than the third estimated state of charge; and a current error determining unit that receives a measured temperature and the measured current of the secondary battery and outputs the upper limit and the lower limit of the error as variables corresponding to the received measured temperature and measured current to the current-caused estimated state of charge calculating unit.

2. The state of charge computation system according to claim 1, further comprising:

a battery capacity error determining unit, wherein the battery capacity error determining unit receives the measured temperature and the measured current and outputs the battery capacity as a variable corresponding to the received measured temperature and measured current to the current-caused estimated state of charge calculating unit.

3. The state of charge computation system according to claim 2, wherein the battery capacity error determining unit outputs a battery capacity error upper limit and a battery capacity error lower limit as variables corresponding to the measured temperature and the measured current to the current-caused estimated state of charge calculating unit, and the current-caused estimated state of charge calculating unit outputs the second estimated state of charge on the basis of the result obtained by integrating the measured current and the upper limit of the error of the measured current with the predetermined cycle, the battery capacity, the battery capacity error upper limit, and the battery capacity error lower limit and outputs the third estimated state of charge on the basis of the result obtained by integrating the measured current and the lower limit of the error of the measured current with the predetermined period, the battery capacity, the battery capacity error upper limit, and the battery capacity error lower limit.

4. The state of charge computation system according to claim 3, further comprising:

an impedance modeling unit that receives the measured temperature, the measured current, and the state of charge and outputs an estimated impedance voltage on the basis of the received measured temperature, measured current, and state of charge;

an estimated impedance voltage correcting unit that receives the estimated impedance voltage, multiplies the received estimated impedance voltage by a predetermined correction coefficient, and outputs a corrected estimated impedance voltage; and an estimated open voltage calculating unit that receives the measured voltage and the corrected estimated impedance voltage, subtracts the corrected estimated impedance voltage from the measured voltage, and outputs the calculation result as the estimated open voltage to the voltage-caused estimated state of charge calculating unit.

5. The state of charge computation system according to claim 3, further comprising:

a display unit that receives the state of charge and displays the state of charge; and an electric motor that is driven by the secondary battery, wherein the state of charge computation system is any one of an industrial vehicle, an electric vehicle, a hybrid vehicle, a ship, and an airplane.

6. The state of charge computation system according to claim 2, further comprising:

an impedance modeling unit that receives the measured temperature, the measured current, and the state of charge and outputs an estimated impedance voltage on the basis of the received measured temperature, measured current, and state of charge;

an estimated impedance voltage correcting unit that receives the estimated impedance voltage, multiplies the received estimated impedance voltage by a predetermined correction coefficient, and outputs a corrected estimated impedance voltage; and an estimated open voltage calculating unit that receives the measured voltage and the corrected estimated impedance voltage, subtracts the corrected estimated impedance voltage from the measured voltage, and outputs the calculation result as the estimated open voltage to the voltage-caused estimated state of charge calculating unit.

7. The state of charge computation system according to claim 2, further comprising:

a display unit that receives the state of charge and displays the state of charge; and an electric motor that is driven by the secondary battery, wherein the state of charge computation system is any one of an industrial vehicle, an electric vehicle, a hybrid vehicle, a ship, and an airplane.

8. The state of charge computation system according to claim 1, further comprising:

an impedance modeling unit that receives the measured temperature, the measured current, and the state of charge and outputs an estimated impedance voltage on the basis of the received measured temperature, measured current, and state of charge;

an estimated impedance voltage correcting unit that receives the estimated impedance voltage, multiplies the received estimated impedance voltage by a predetermined correction coefficient, and outputs a corrected estimated impedance voltage; and an estimated open voltage calculating unit that receives the measured voltage and the corrected estimated impedance voltage, subtracts the corrected estimated impedance voltage from the measured voltage, and outputs the calculation result as the estimated open voltage to the voltage-caused estimated state of charge calculating unit.

9. The state of charge computation system according to claim 8, further comprising:

a display unit that receives the state of charge and displays the state of charge; and an electric motor that is driven by the secondary battery, wherein the state of charge computation system is any one of an industrial vehicle, an electric vehicle, a hybrid vehicle, a ship, and an airplane.

10. The state of charge computation system according to claim 1, further comprising:

a display unit that receives the state of charge and displays the state of charge; and an electric motor that is driven by the secondary battery, wherein the state of charge computation system is any one of an industrial vehicle, an electric vehicle, a hybrid vehicle, a ship, and an airplane.

* * * * *